United States Patent
Adibi et al.

(10) Patent No.: US 8,871,619 B2
(45) Date of Patent: Oct. 28, 2014

(54) APPLICATION SPECIFIC IMPLANT SYSTEM AND METHOD FOR USE IN SOLAR CELL FABRICATIONS

(75) Inventors: Babak Adibi, Los Altos, CA (US); Edward S. Murrer, Aptos, CA (US)

(73) Assignee: Intevac, Inc., Santa Clara, CA (US)

( * ) Notice: Subject to any disclaimer, the term of this patent is extended or adjusted under 35 U.S.C. 154(b) by 1252 days.

(21) Appl. No.: 12/482,947

(22) Filed: Jun. 11, 2009

(65) Prior Publication Data

US 2009/0309039 A1 Dec. 17, 2009

Related U.S. Application Data

(60) Provisional application No. 61/131,687, filed on Jun. 11, 2008, provisional application No. 61/131,688, (Continued)

(51) Int. Cl.
*H01L 21/265* (2006.01)
*H01L 21/266* (2006.01)
(Continued)

(52) U.S. Cl.
CPC ............. *H01L 21/266* (2013.01); *Y02E 10/547* (2013.01); *H01L 31/1804* (2013.01); *H01L 31/072* (2013.01); *H01L 21/26513* (2013.01); *H01L 31/022425* (2013.01)
USPC ...... 438/514; 438/57; 257/439; 257/E21.334; 257/E31.038

(58) Field of Classification Search
CPC . H01L 21/263; H01L 21/265; H01L 21/2652; H01L 21/26553; H01L 21/266; H01L 21/38; H01L 21/425; H01L 21/426
USPC .................... 438/57, 514; 257/439, E31.038, 257/E21.334
See application file for complete search history.

(56) References Cited

U.S. PATENT DOCUMENTS

| 3,607,450 A | 9/1971 | Kiewit |
| 3,786,359 A | 1/1974 | King |

(Continued)

FOREIGN PATENT DOCUMENTS

| CN | 1198597 A | 11/1998 |
| CN | 1638015 A | 7/2005 |

(Continued)

OTHER PUBLICATIONS

Anders, "Plasma and Ion Sources in Large Area Coating: A Review", www.sciencedirect.com, Surface Coatings & Technology, Nov. 21, 2005, vol. 200, Issues: 5-6, pp. 1893-1906, Berkeley CA.

(Continued)

*Primary Examiner* — Mamadou Diallo
*Assistant Examiner* — Joanne A Garcia
(74) *Attorney, Agent, or Firm* — Nixon Peabody LLP; Joseph Bach, Esq.

(57) ABSTRACT

Solar cells and other semiconductor devices are fabricated more efficiently and for less cost using an implanted doping fabrication system. A system for implanting a semiconductor substrate includes an ion source (such as a single-species delivery module), an accelerator to generate from the ion source an ion beam having an energy of no more than 150 kV, and a beam director to expose the substrate to the beam. In one embodiment, the ion source is single-species delivery module that includes a single-gas delivery element and a single-ion source. Alternatively, the ion source is a plasma source used to generate a plasma beam. The system is used to fabricate solar cells having lightly doped photo-receptive regions and more highly doped grid lines. This structure reduces the formation of "dead layers" and improves the contact resistance, thereby increasing the efficiency of a solar cell.

15 Claims, 9 Drawing Sheets

Related U.S. Application Data filed on Jun. 11, 2008, provisional application No. 61/131,698, filed on Jun. 11, 2008, provisional application No. 61/133,028, filed on Jun. 24, 2008, provisional application No. 61/210,545, filed on Mar. 20, 2004.

(51) Int. Cl.
*H01L 21/425* (2006.01)
*H01L 21/426* (2006.01)
*H01L 31/08* (2006.01)
*H01L 31/10* (2006.01)
*H01L 31/18* (2006.01)
*H01L 31/072* (2012.01)
*H01L 31/0224* (2006.01)

(56) References Cited

U.S. PATENT DOCUMENTS

| | | | |
|---|---|---|---|
| 3,790,412 A | 2/1974 | Moline | |
| 3,948,682 A | 4/1976 | Bordina et al. | 136/89 |
| 3,969,163 A | 7/1976 | Wakefield | 148/174 |
| 3,969,746 A | 7/1976 | Kendall et al. | 357/30 |
| 3,976,508 A | 8/1976 | Mlavsky | 136/89 |
| 4,001,864 A | 1/1977 | Gibbons | 357/30 |
| 4,004,949 A | 1/1977 | Lesk | 148/1.5 |
| 4,021,276 A | 5/1977 | Cho et al. | |
| 4,029,518 A | 6/1977 | Matsutani et al. | 136/89 |
| 4,056,404 A | 11/1977 | Garone et al. | 136/89 |
| 4,070,205 A | 1/1978 | Rahilly | 136/89 |
| 4,070,689 A | 1/1978 | Coleman et al. | 357/30 |
| 4,072,541 A | 2/1978 | Meulenberg, Jr. et al. | 136/89 |
| 4,086,102 A | 4/1978 | King | |
| 4,090,213 A | 5/1978 | Maserjian et al. | 357/30 |
| 4,095,329 A | 6/1978 | Ravi | 29/572 |
| 4,116,717 A | 9/1978 | Rahilly | 136/89 |
| RE29,833 E | 11/1978 | Mlavsky | 136/89 |
| 4,131,486 A | 12/1978 | Brandhorst, Jr. | 136/89 |
| 4,131,488 A * | 12/1978 | Lesk et al. | 438/71 |
| 4,141,756 A | 2/1979 | Chiang et al. | 148/1.5 |
| 4,144,094 A | 3/1979 | Coleman et al. | 136/89 |
| 4,152,536 A | 5/1979 | Ravi | 136/89 |
| 4,152,824 A | 5/1979 | Gonsiorawski | 29/572 |
| 4,179,311 A | 12/1979 | Athanas | 148/1.5 |
| 4,219,830 A | 8/1980 | Gibbons | 357/30 |
| 4,227,941 A | 10/1980 | Bozler et al. | 136/255 |
| 4,253,881 A | 3/1981 | Hezel | 136/256 |
| 4,273,950 A | 6/1981 | Chitre | 136/255 |
| 4,295,002 A | 10/1981 | Chappell et al. | 136/244 |
| 4,301,592 A | 11/1981 | Lin | 29/590 |
| 4,322,571 A | 3/1982 | Stanbery | 136/255 |
| 4,353,160 A | 10/1982 | Armini et al. | |
| RE31,151 E | 2/1983 | King | |
| 4,377,722 A | 3/1983 | Wested | 136/244 |
| 4,379,944 A | 4/1983 | Borden et al. | 136/259 |
| 4,404,422 A | 9/1983 | Green et al. | 136/255 |
| 4,421,577 A | 12/1983 | Spicer | 148/187 |
| 4,428,783 A | 1/1984 | Gessert | 148/172 |
| 4,448,865 A | 5/1984 | Bohlen et al. | |
| 4,449,286 A | 5/1984 | Dahlberg | 29/572 |
| 4,456,489 A | 6/1984 | Wu | 148/1.5 |
| 4,479,027 A | 10/1984 | Todorof | 136/249 |
| 4,490,573 A | 12/1984 | Gibbons | 136/255 |
| 4,495,375 A | 1/1985 | Rickus et al. | 136/255 |
| 4,522,657 A | 6/1985 | Rohatgi et al. | |
| 4,524,237 A | 6/1985 | Ross et al. | 136/261 |
| 4,533,831 A | 8/1985 | Itoh et al. | |
| 4,539,431 A | 9/1985 | Moddel et al. | 136/258 |
| 4,540,843 A | 9/1985 | Gochermann et al. | 136/251 |
| 4,542,256 A | 9/1985 | Wiedeman | 136/249 |
| 4,581,620 A | 4/1986 | Yamazaki et al. | 357/2 |
| 4,587,430 A | 5/1986 | Adler | |
| 4,589,191 A | 5/1986 | Green et al. | 29/572 |
| 4,633,138 A | 12/1986 | Tokiguchi et al. | |
| 4,665,277 A | 5/1987 | Sah et al. | 136/255 |
| 4,667,060 A | 5/1987 | Spitzer | 136/255 |
| 4,676,845 A | 6/1987 | Spitzer | 148/33.3 |
| 4,681,983 A | 7/1987 | Markvart et al. | 136/255 |
| 4,719,355 A | 1/1988 | Meyers et al. | |
| 4,758,525 A | 7/1988 | Kida et al. | 437/2 |
| 4,828,628 A | 5/1989 | Hezel et al. | 136/255 |
| 4,830,678 A | 5/1989 | Todorof et al. | 136/259 |
| 4,834,805 A | 5/1989 | Erbert | 136/246 |
| 4,886,555 A | 12/1989 | Hackstein et al. | 136/255 |
| 4,900,369 A | 2/1990 | Hezel et al. | 136/255 |
| 5,009,720 A | 4/1991 | Hokuyo et al. | 136/255 |
| 5,112,409 A | 5/1992 | Warfield et al. | 136/256 |
| 5,125,983 A | 6/1992 | Cummings | 136/246 |
| 5,132,544 A | 7/1992 | Glavish | |
| 5,290,367 A | 3/1994 | Hayashi et al. | 136/255 |
| 5,306,647 A | 4/1994 | Lehmann et al. | 437/2 |
| 5,330,584 A | 7/1994 | Saga et al. | 136/255 |
| 5,356,488 A | 10/1994 | Hezel | 136/256 |
| 5,374,456 A | 12/1994 | Matossian et al. | 427/570 |
| 5,421,889 A | 6/1995 | Pollack et al. | |
| 5,516,725 A | 5/1996 | Chang et al. | |
| 5,554,854 A * | 9/1996 | Blake | 250/492.21 |
| 5,583,368 A | 12/1996 | Kenney | |
| H1637 H | 3/1997 | Offord et al. | |
| 5,641,362 A | 6/1997 | Meier | 136/256 |
| 5,693,376 A | 12/1997 | Fetherston et al. | 427/523 |
| 5,760,405 A | 6/1998 | King et al. | |
| 5,831,321 A | 11/1998 | Nagayama | |
| 5,883,391 A | 3/1999 | Adibi et al. | |
| 5,885,896 A | 3/1999 | Thakur et al. | |
| 5,907,158 A | 5/1999 | Nasser-Ghodsi et al. | |
| 5,932,882 A | 8/1999 | England et al. | |
| 5,935,345 A | 8/1999 | Kuznicki | 136/255 |
| 5,945,012 A | 8/1999 | Chan | |
| 5,963,801 A | 10/1999 | Aronowitz et al. | |
| 5,985,742 A | 11/1999 | Henley et al. | |
| 5,988,103 A | 11/1999 | Fetherston et al. | 118/723 E |
| 5,994,207 A | 11/1999 | Henley et al. | |
| 5,998,282 A | 12/1999 | Lukaszek | |
| 6,006,253 A | 12/1999 | Kumar et al. | |
| 6,010,579 A | 1/2000 | Henley et al. | |
| 6,013,563 A | 1/2000 | Henley et al. | |
| 6,016,036 A | 1/2000 | Brailove | |
| 6,033,974 A | 3/2000 | Henley et al. | |
| 6,034,321 A | 3/2000 | Jenkins | 136/252 |
| 6,048,411 A | 4/2000 | Henley et al. | |
| 6,051,073 A | 4/2000 | Chu et al. | |
| 6,060,718 A | 5/2000 | Brailove et al. | |
| 6,083,324 A | 7/2000 | Henley et al. | |
| 6,084,175 A | 7/2000 | Perry et al. | 136/256 |
| 6,091,021 A | 7/2000 | Ruby et al. | 136/261 |
| 6,093,625 A | 7/2000 | Wagner et al. | |
| 6,103,599 A | 8/2000 | Henley et al. | |
| 6,113,735 A | 9/2000 | Chu et al. | |
| 6,120,660 A | 9/2000 | Chu et al. | |
| 6,130,380 A | 10/2000 | Nakamura | |
| 6,138,606 A | 10/2000 | Ling | |
| 6,146,979 A | 11/2000 | Henley et al. | |
| 6,150,708 A | 11/2000 | Gardner et al. | |
| 6,153,524 A | 11/2000 | Henley et al. | |
| 6,155,909 A | 12/2000 | Henley et al. | |
| 6,159,824 A | 12/2000 | Henley et al. | |
| 6,159,825 A | 12/2000 | Henley et al. | |
| 6,162,705 A | 12/2000 | Henley et al. | |
| 6,171,965 B1 | 1/2001 | Kang et al. | |
| 6,180,496 B1 | 1/2001 | Farrens et al. | |
| 6,184,111 B1 | 2/2001 | Henley et al. | |
| 6,186,091 B1 | 2/2001 | Chu et al. | |
| 6,200,883 B1 | 3/2001 | Taylor et al. | |
| 6,204,151 B1 | 3/2001 | Malik et al. | |
| 6,207,005 B1 | 3/2001 | Henley et al. | |
| 6,213,050 B1 | 4/2001 | Liu et al. | |
| 6,217,724 B1 | 4/2001 | Chu et al. | |
| 6,221,740 B1 | 4/2001 | Bryan et al. | |
| 6,221,774 B1 | 4/2001 | Malik | |
| 6,228,176 B1 | 5/2001 | Chu et al. | |
| 6,245,161 B1 | 6/2001 | Henley et al. | |
| 6,248,649 B1 | 6/2001 | Henley et al. | |

(56) References Cited

U.S. PATENT DOCUMENTS

| | | | |
|---|---|---|---|
| 6,263,941 B1 | 7/2001 | Bryan et al. | |
| 6,265,328 B1 | 7/2001 | Henley et al. | |
| 6,269,765 B1 | 8/2001 | Chu et al. | |
| 6,271,566 B1 | 8/2001 | Tsuchiaki | 257/347 |
| 6,274,459 B1 | 8/2001 | Chan | |
| 6,281,428 B1 | 8/2001 | Chiu et al. | 136/255 |
| 6,287,941 B1 | 9/2001 | Kang et al. | |
| 6,290,804 B1 | 9/2001 | Henley et al. | |
| 6,291,313 B1 | 9/2001 | Henley et al. | |
| 6,291,314 B1 | 9/2001 | Henley et al. | |
| 6,291,326 B1 | 9/2001 | Henley et al. | |
| 6,294,434 B1 | 9/2001 | Tseng | |
| 6,300,227 B1 | 10/2001 | Liu et al. | |
| 6,321,134 B1 | 11/2001 | Henley et al. | |
| 6,335,534 B1 | 1/2002 | Suguro et al. | |
| 6,338,313 B1 | 1/2002 | Chan | |
| 6,365,492 B1 | 4/2002 | Suguro et al. | |
| 6,383,876 B1 | 5/2002 | Son et al. | 438/289 |
| 6,391,740 B1 | 5/2002 | Cheung et al. | |
| 6,417,515 B1 | 7/2002 | Barrett et al. | |
| 6,429,037 B1 | 8/2002 | Wenham et al. | |
| 6,448,152 B1 | 9/2002 | Henley et al. | |
| 6,458,723 B1 | 10/2002 | Henley et al. | |
| 6,468,884 B2 | 10/2002 | Miyake et al. | 438/481 |
| 6,476,313 B2 | 11/2002 | Kawano | 136/255 |
| 6,486,478 B1 | 11/2002 | Libby et al. | |
| 6,489,241 B1 | 12/2002 | Thilderkvist et al. | |
| 6,495,010 B2 | 12/2002 | Sferlazzo | |
| 6,500,732 B1 | 12/2002 | Henley et al. | |
| 6,507,689 B2 | 1/2003 | Tirloni et al. | 385/127 |
| 6,534,381 B2 | 3/2003 | Cheung et al. | |
| 6,544,862 B1 | 4/2003 | Bryan | |
| 6,552,259 B1 | 4/2003 | Hosomi et al. | 136/255 |
| 6,552,414 B1 | 4/2003 | Horzel et al. | 257/655 |
| 6,594,579 B1 | 7/2003 | Lowrey et al. | |
| 6,604,033 B1 | 8/2003 | Banet et al. | |
| 6,611,740 B2 | 8/2003 | Lowrey et al. | |
| 6,613,974 B2 | 9/2003 | Husher | 136/255 |
| 6,632,324 B2 | 10/2003 | Chan | |
| 6,636,790 B1 | 10/2003 | Lightner et al. | |
| 6,660,928 B1 | 12/2003 | Patton et al. | 136/249 |
| 6,732,031 B1 | 5/2004 | Lightner et al. | |
| 6,780,759 B2 | 8/2004 | Farrens et al. | |
| 6,787,693 B2 | 9/2004 | Lizotte | 136/261 |
| 6,874,515 B2 | 4/2005 | Ishihara et al. | |
| 6,949,895 B2 * | 9/2005 | DiVergilio et al. | 315/505 |
| 7,011,733 B2 | 3/2006 | Sandhu | |
| 7,022,984 B1 | 4/2006 | Rathmell et al. | |
| 7,078,317 B2 | 7/2006 | Henley | |
| 7,081,186 B2 | 7/2006 | Ehiasarian et al. | |
| 7,094,666 B2 | 8/2006 | Henley et al. | |
| 7,098,394 B2 | 8/2006 | Armer et al. | 136/244 |
| 7,147,709 B1 | 12/2006 | Ong et al. | |
| 7,166,520 B1 | 1/2007 | Henley | |
| 7,174,243 B1 | 2/2007 | Lightner et al. | |
| 7,225,047 B2 | 5/2007 | Al-Bayati et al. | |
| 7,225,065 B1 | 5/2007 | Hunt et al. | |
| 7,228,211 B1 | 6/2007 | Lowrey et al. | |
| 7,250,323 B2 | 7/2007 | Gadeken et al. | |
| 7,339,110 B1 | 3/2008 | Mulligan et al. | 136/256 |
| 7,354,815 B2 | 4/2008 | Henley | |
| 7,390,724 B2 | 6/2008 | Henley et al. | |
| 7,399,680 B2 | 7/2008 | Henley | |
| 7,427,554 B2 | 9/2008 | Henley et al. | |
| 7,447,574 B1 | 11/2008 | Washicko et al. | |
| 7,477,968 B1 | 1/2009 | Lowrey et al. | |
| 7,479,441 B2 | 1/2009 | Kirk et al. | |
| 7,480,551 B1 | 1/2009 | Lowrey et al. | |
| 7,498,245 B2 | 3/2009 | Aspar et al. | |
| 7,521,699 B2 | 4/2009 | Yamazaki et al. | |
| 7,523,159 B1 | 4/2009 | Williams et al. | |
| 7,532,962 B1 | 5/2009 | Lowrey et al. | |
| 7,532,963 B1 | 5/2009 | Lowrey et al. | |
| 7,547,609 B2 | 6/2009 | Henley | |
| 7,598,153 B2 | 10/2009 | Henley et al. | |
| 7,674,687 B2 | 3/2010 | Henley | |
| 7,727,866 B2 | 6/2010 | Bateman et al. | |
| 7,759,220 B2 | 7/2010 | Henley | |
| 7,767,561 B2 | 8/2010 | Hanawa et al. | |
| 7,772,088 B2 | 8/2010 | Henley et al. | |
| 7,776,727 B2 | 8/2010 | Borden | |
| 7,796,849 B2 | 9/2010 | Adibi et al. | |
| 7,867,409 B2 | 1/2011 | Brcka | |
| 2001/0002584 A1 | 6/2001 | Liu et al. | |
| 2001/0017109 A1 | 8/2001 | Liu et al. | |
| 2001/0020485 A1 | 9/2001 | Ford et al. | |
| 2002/0090758 A1 | 7/2002 | Henley et al. | |
| 2002/0109233 A1 | 8/2002 | Farrar | |
| 2002/0109824 A1 * | 8/2002 | Yamaguchi et al. | 355/53 |
| 2002/0139666 A1 | 10/2002 | Hsueh et al. | |
| 2002/0144725 A1 | 10/2002 | Jordan et al. | |
| 2002/0185700 A1 | 12/2002 | Coffa et al. | |
| 2003/0015700 A1 | 1/2003 | Eisenbeiser et al. | |
| 2003/0106643 A1 | 6/2003 | Tabuchi et al. | |
| 2003/0137050 A1 | 7/2003 | Chambers et al. | |
| 2004/0025932 A1 | 2/2004 | Husher | |
| 2004/0067644 A1 | 4/2004 | Malik et al. | |
| 2004/0112426 A1 | 6/2004 | Hagino | |
| 2004/0187916 A1 | 9/2004 | Hezel | |
| 2004/0198028 A1 | 10/2004 | Tanaka et al. | |
| 2005/0045835 A1 | 3/2005 | DiVergilio et al. | |
| 2005/0150597 A1 | 7/2005 | Henley et al. | |
| 2005/0181584 A1 * | 8/2005 | Foad et al. | 438/514 |
| 2005/0247668 A1 | 11/2005 | Malik et al. | |
| 2006/0019039 A1 | 1/2006 | Hanawa et al. | |
| 2006/0148241 A1 | 7/2006 | Brody et al. | |
| 2006/0157733 A1 | 7/2006 | Lucovsky et al. | |
| 2006/0166394 A1 | 7/2006 | Kukulka et al. | |
| 2006/0211219 A1 | 9/2006 | Henley et al. | |
| 2006/0234484 A1 | 10/2006 | Lanzerotti et al. | |
| 2006/0279970 A1 * | 12/2006 | Kernahan | 363/65 |
| 2007/0012503 A1 | 1/2007 | Iida | |
| 2007/0029043 A1 | 2/2007 | Henley | |
| 2007/0032044 A1 | 2/2007 | Henley | |
| 2007/0035847 A1 | 2/2007 | Li et al. | |
| 2007/0081138 A1 | 4/2007 | Kerkhof et al. | 355/71 |
| 2007/0084505 A1 | 4/2007 | Zaidi | |
| 2007/0087574 A1 | 4/2007 | Gupta et al. | |
| 2007/0134840 A1 | 6/2007 | Gadeken et al. | |
| 2007/0148336 A1 | 6/2007 | Bachrach et al. | |
| 2007/0169806 A1 | 7/2007 | Fork et al. | 136/256 |
| 2007/0209707 A1 | 9/2007 | Weltman | |
| 2007/0217020 A1 | 9/2007 | Li et al. | 359/652 |
| 2007/0235074 A1 | 10/2007 | Henley et al. | |
| 2007/0277875 A1 | 12/2007 | Gadkaree et al. | |
| 2007/0281172 A1 | 12/2007 | Couillard et al. | |
| 2008/0001139 A1 | 1/2008 | Augusto | |
| 2008/0038076 A1 | 2/2008 | Henley | |
| 2008/0044964 A1 | 2/2008 | Kamath et al. | 438/164 |
| 2008/0078444 A1 | 4/2008 | Atanackovic | |
| 2008/0092944 A1 | 4/2008 | Rubin | |
| 2008/0092947 A1 | 4/2008 | Lopatin et al. | |
| 2008/0121275 A1 | 5/2008 | Ito et al. | |
| 2008/0121276 A1 | 5/2008 | Lopatin et al. | 136/256 |
| 2008/0128019 A1 | 6/2008 | Lopatin et al. | |
| 2008/0128641 A1 | 6/2008 | Henley et al. | 250/492.21 |
| 2008/0164819 A1 | 7/2008 | Hwang et al. | |
| 2008/0179547 A1 | 7/2008 | Henley | |
| 2008/0188011 A1 | 8/2008 | Henley | |
| 2008/0190886 A1 | 8/2008 | Choi et al. | |
| 2008/0206962 A1 | 8/2008 | Henley et al. | |
| 2008/0242065 A1 | 10/2008 | Brcka | |
| 2008/0296261 A1 | 12/2008 | Zhao et al. | |
| 2009/0081860 A1 | 3/2009 | Zhou et al. | |
| 2009/0124064 A1 | 5/2009 | England et al. | 438/486 |
| 2009/0124065 A1 | 5/2009 | England et al. | 438/486 |
| 2009/0142875 A1 | 6/2009 | Borden et al. | |
| 2009/0152162 A1 | 6/2009 | Tian et al. | |
| 2009/0162970 A1 | 6/2009 | Yang | 438/96 |
| 2009/0206275 A1 | 8/2009 | Henley et al. | |
| 2009/0227061 A1 | 9/2009 | Bateman et al. | |
| 2009/0227062 A1 | 9/2009 | Sullivan et al. | 438/61 |
| 2009/0227094 A1 | 9/2009 | Bateman et al. | |
| 2009/0227095 A1 | 9/2009 | Bateman et al. | |

(56) References Cited

U.S. PATENT DOCUMENTS

| | | |
|---|---|---|
| 2009/0227097 A1 | 9/2009 | Bateman et al. |
| 2009/0289197 A1 | 11/2009 | Slocum et al. |
| 2009/0308439 A1 | 12/2009 | Adibi et al. |
| 2009/0308440 A1 | 12/2009 | Adibi et al. |
| 2009/0308450 A1 | 12/2009 | Adibi et al. |
| 2009/0317937 A1 | 12/2009 | Gupta et al. .................... 438/80 |
| 2010/0041176 A1 | 2/2010 | Sullivan et al. ................. 438/72 |
| 2010/0055874 A1 | 3/2010 | Henley |
| 2010/0059362 A1 | 3/2010 | Anella ...................... 204/192.11 |
| 2010/0110239 A1 | 5/2010 | Ramappa et al. |
| 2010/0124799 A1 | 5/2010 | Blake et al. |
| 2010/0167511 A1 | 7/2010 | Leung et al. |
| 2010/0178723 A1 | 7/2010 | Henley |
| 2010/0180945 A1 | 7/2010 | Henley et al. |
| 2010/0184243 A1 | 7/2010 | Low et al. |
| 2010/0184248 A1 | 7/2010 | Hilali et al. |
| 2010/0197125 A1 | 8/2010 | Low et al. |
| 2010/0229928 A1 | 9/2010 | Zuniga et al. |
| 2010/0240169 A1 | 9/2010 | Petti et al. |
| 2010/0240183 A1 | 9/2010 | Narazaki |
| 2010/0323508 A1 | 12/2010 | Adibi et al. |
| 2011/0162703 A1 | 7/2011 | Adibi et al. |
| 2011/0192993 A1 | 8/2011 | Chun et al. |
| 2011/0309050 A1 | 12/2011 | Iori et al. |
| 2012/0122273 A1 | 5/2012 | Chun et al. |
| 2012/0125259 A1 | 5/2012 | Adibi et al. |
| 2012/0129325 A1 | 5/2012 | Adibi et al. |

FOREIGN PATENT DOCUMENTS

| | | | |
|---|---|---|---|
| DE | 4217428 A1 | 6/1993 | |
| DE | 19820152 A1 | 11/1999 | |
| JP | 63-143876 A | 6/1988 | |
| JP | 7-135329 A | 5/1995 | |
| KR | 100759084 B | 9/2007 | |
| WO | WO2009/033134 A2 | 3/2009 | ............ H01L 31/042 |
| WO | WO2009/033134 A3 | 3/2009 | ............ H01L 31/042 |
| WO | WO2009/064867 A2 | 5/2009 | ............. H01L 21/26 |
| WO | WO2009/064867 A3 | 5/2009 | ............. H01L 21/26 |
| WO | WO2009/064872 A2 | 5/2009 | ............. H01L 21/26 |
| WO | WO2009/064872 A3 | 5/2009 | ............. H01L 21/26 |
| WO | WO2009/064875 A1 | 5/2009 | ............. H01L 21/20 |
| WO | WO2009/085948 A2 | 7/2009 | ............ H01L 31/042 |
| WO | WO2009/085948 A3 | 7/2009 | ............ H01L 31/042 |
| WO | WO2009/111665 A2 | 9/2009 | ............ H01L 21/266 |
| WO | WO2009/111665 A3 | 9/2009 | ............ H01L 21/265 |
| WO | WO2009/111666 A2 | 9/2009 | ............ H01L 21/266 |
| WO | WO2009/111666 A3 | 9/2009 | ............ H01L 31/042 |
| WO | WO2009/111667 A2 | 9/2009 | ............. H01L 31/18 |
| WO | WO2009/111667 A3 | 9/2009 | ............ H01L 31/042 |
| WO | WO2009/111668 A2 | 9/2009 | ............ H01L 31/042 |
| WO | WO2009/111668 A3 | 9/2009 | ............ H01L 31/042 |
| WO | WO2009/111668 A9 | 9/2009 | ............ H01L 31/042 |
| WO | WO2009/111669 A2 | 9/2009 | ............. H01L 21/00 |
| WO | WO2009/111669 A3 | 9/2009 | ............ H01L 31/042 |
| WO | WO2009/155498 A2 | 12/2009 | ............ H01L 21/265 |
| WO | WO2010/030645 A2 | 3/2010 | ............ H01L 31/042 |

OTHER PUBLICATIONS

Cornet et al., "A New Algorithm for Charge Deposition Multiple-Grid for PIC Simulations in r-z Cylindrical Coordinates", www.sciencedirect.com, Jounal of Computational Physics, Jul. 1, 2007 vol. 225, Issue 1, pp. 808-828, Sydney, Australia.

Douglas et al., "A Study of the Factors Which Control the Efficiency of Ion-Implanted Silicon Solar Cells", IEEE Transactions on Electron Devices, vol. ED-27, No. 4, Apr. 1980, pp. 792-802.

Fu et al., "Enhancement of Implantation Energy Using a Conducting Grid in Plasma Immersion Ion Implantation of Dielectric/Polymeric Materials", Review of Scientific Instruments, vol. 74, No. 8, Aug. 2003, pp. 3697-3700.

Goeckner et al., "Plasma Doping for Shallow Junctions", Journal of Vacuum Science and Technology B, vol. 17, Issue: 5, Sep. 1999, pp. 2290-2293.

Jacques et al., "Plasma-Based Ion Implantation and Deposition: A Review of Physics, Technology, and Applications", http://www.escholarship.org/uc/item/84k974r2, Lawrence Berkeley National Laboratory, May 16, 2005, pp. 1-69.

Jager-Hezel, "Developments for Large-Scale Production of High-Efficiency Silicon Solar Cells," Advances in Solid State Physics, vol. 34, Jan. 1994, pp. 97-113, <http://www.springerlink.com/content/982620t34312416v/>.

Kwok et al., "One-Step, Non-Contact Pattern Transfer by Direct-Current Plasma Immersion Ion Implantation", Journal of Physics D: Applied Physics, IOP Publishing, vol. 42, No. 19, Sep. 2009, pp. 1-6.

Kwok et al., "One-Step Non-Contact Pattern Transferring by Plasma Based Ion Implantation", Journal of Physics D: Applied Physics, IOP Publishing, vol. 41, No. 22, Oct. 2008, pp. 1-6.

Minnucci et al., "Tailored Emitter, Low-Resistivity, Ion-Implanted Silicon Solar Cells", IEEE Transactions on Electron Devices, vol. ED-27, No. 4, Apr. 1980, pp. 802-806.

Nielsen, "Ion Implanted Polycrystalline Silicon Solar Cells", Physica Scripta, vol. 24, No. 2, Aug. 1, 1981, pp. 390-391.

Sopian et al., "Plasma Implantation for Emitter and Localized back Surface Field (BSF) Formation in Silicon Cells", European Journal of Scientific Research, http://www.eurojournals.com/ejsr.htm, ISSN 1450-216X, vol. 24, No. 3, Jan. 2008, pp. 365-372.

Tang et al., "Current Control for Magnetized Plasma in Direct-Current Plasma-Immersion Ion Implantation", American Institute of Physics, Applied Physics Letters, vol. 82, No. 13, Mar. 31, 2003, pp. 2014-2016.

Xu et al., "Etching of Nanopatterns in Silicon Using Nanopantography", Applied Physics Letters, vol. 92, Jan. 9, 2008, pp. 1-3.

Xu et al., "Nanopantogrpaphy: A New Method for Massively Parallel Nanopatterning Over Large Areas", Nano Letters, vol. 5, No. 12, Jan. 2005, pp. 2563-2568.

Yankov et al., "Plasma Immersion Ion Implantation for Silicon Processing", Annalen der Physik, vol. 10, Issue: 4, Feb. 2001, pp. 279-298.

Young et al., "High-Efficiency Si Solar Cells by Beam Processing", Applied Physics Letters, vol. 43, Issue: 7, Oct. 1, 1983, pp. 666-668.

Zeng et al., "Steady-State, Direct-Current (DC) Plasma Immersion Ion Implantation (PIII) for Planar Samples", IEEE, Jan. 2000, pp. 515-519.

Zeng et al., "Steady-State Direct-Current Plasma Immersion Ion Implantation Using an Electron Cyclotron Resonance Plasma Source", Thin Solid Films, www.elsevier.com/locate/tsf, vol. 390, Issues: 1-2, Jun. 30, 2001, pp. 145-148.

Com-Nougue et al., "CW CO2 Laser Annealing Associated with Ion Implantation for Production of Silicon Solar Cell Junctions", Jan. 1982, IEEE, p. #770.

Armini et al., "Nuclear Instruments and Methods in Physics Research B6", Jan. 1985, Vol. 94-99, 1 Page, North-Holland, Amsterdam, Spire Corporation, Patriots Park, Bedford, Massachusetts 01730, USA.

In the Unites States Patent and Trademark Office, U.S. Appl. No. 61/033,873, filed Mar. 5, 2008, Entitled: "Use of Chained Implants in Solar Cells", First Named Inventor: Nicholas Bateman et al., Company: Varian Semiconductor Equipment Associates, Inc., Gloucester, Massachusetts.

In the Unites States Patent and Trademark Office, U.S. Appl. No. 61/095,010, filed Sep. 8, 2008, Entitled: "Use of Dopants With Different Diffusivities for Solar Cell Manufacture", First Named Inventor: Nicholas Bateman et al., Company: Varian Semiconductor Equipment Associates, Inc., Gloucester, Massachusetts.

Donnelly et al., "Nanopantography: A Method for Parallel Writing of Etched and Deposited Nanopatterns", Oct. 2009, University of Houston, Houston, TX, 36 pages.

Examination Report in 048635-108068 dated Jul. 26, 2012 (Singapore Application No. 201009185-8).

Notice of Allowance and Fee(s) Due in 048635-108000 dated Sep. 6, 2012 (U.S. Appl. No. 12/482,685).

"Notification of Transmittal of The International Search Report and The Written Opinion of The International Searching Authority, or The Declaration," Date of mailing: Apr. 6, 2011, International Application No. PCT/US11/24244, International Filing Date: Feb. 9, 2011, Authorized Officer: Blaine R. Copenheaver, pp. 1-9.

(56) References Cited

OTHER PUBLICATIONS

"Notification of Transmittal of The International Search Report and The Written Opinion of The International Searching Authority, or The Declaration," Date of mailing: May 25, 2010, International Application No. PCT/US10/28058, International Filing Date, Mar. 19, 2010, Authorized Officer: Lee W. Young, pp. 1-9.

"Notification of Transmittal of The International Search Report and The Written Opinion of The International Searching Authority or The Declaration," Date of mailing: Oct. 7, 2010, International Application No. PCT/US10/039690, International Filing Date. Jun. 23, 2010, Authorized Officer: Blaine R. Copenheaver, pp. 1-12.

"Notification of Transmittal of The International Search Report and the Written Opinion of The International Searching Authority, or The Declaration," Date of mailing: Oct. 2, 2009, International Application No. PCT/US09/47094, International Filing Date: Jun. 11, 2009, Authorized Officer Blaine R. Copenheaver, pp. 1-15.

"Notification of Transmittal of The International Search Report and The Written Opinion of The International Searching Authority, or The Declaration," Date of mailing: Aug. 4, 2009, International Application No. PCT/US09/47102, International Filing Date: Jun. 11, 2009, Authorized Officer: Lee W. Young, pp. 1-11.

"Notification of Transmittal of The International Search Report and The Written Opinion of The International Searching Authority, or The Declaration," Date of mailing: Jul. 29, 2009, International Application No. PCT/US09/47109, International Filing Date: Jun. 11, 2009, Authorized Officer: Lee W. Young, pp. 1-11.

"Notification of Transmittal of The International Search Report and The Written Opinion of The International Searching Authority, or The Declaration," Date of mailing: Jul. 31, 2009, International Application No. PCT/US09/47090, International Filing Date: Jun. 11, 2009, Authorized Officer: Lee W. Yours, pp. 1-10.

"Notification of Transmittal of The International Search Report and The Written Opinion of The International Searching Authority, or The Declaration," Date of mailing: Mar. 29, 2012, International Application No. PCT/US11/61274, International Filing Date: Nov. 17, 2011, Authorized Officer: Lee W. Young, pp. 1-9.

Office Action (Non-Final) dated Feb. 28, 2012 (U.S. Appl. No. 12/482,685).

Office Action (Non-Final) dated Mar. 15, 2012 (U.S. Appl. No. 12/821,053).

Office Action (Final) dated Jun. 6, 2012 (U.S. Appl. No. 12/482,685).

Office Action (Final) dated Aug. 17, 2012 (U.S. Appl. No. 12/821,053).

Office Action (Non-Final) dated Aug. 24, 2012 (U.S. Appl. No. 12/482,980).

Office Action (Non-Final) dated Aug. 31, 2012 (Chinese Application No. 200980127945.7).

Office Action (Non-Final) dated Sep. 25, 2012 (U.S. Appl. No. 12/483,017).

Pelletier et al., "Plasma-Based Ion Implantation and Deposition: A Review of Physics, Technology, and Applications", http://www.escholarship.org/uc/item/84k974r2, Lawrence Berkeley National Laboratory, May 16, 2005, pp. 1-69.

Rentsch, et al., "Technology Route Towards Industrial Appiication of Rear Passivated Silicon Solar Cells", Conference Record of the 2006 IEEE 4th World Conference on Photovoltaic Energy Conversion vol. 1 (2006) pp. 1008-1011.

Restriction Requirement dated Feb. 1, 2012 (U.S. Appl. No. 12/482,685).

Restriction Requirement dated Apr. 24, 2012 (U.S. Appl. No. 12/482,980).

Restriction Requirement dated Apr. 25, 2012 (U.S. Appl. No. 12/483,017).

Restriction Requirement dated Oct. 5, 2012 (U.S. Appl. No. 12/728,105).

Vervisch et al., "Plasma Immersion Ion Implantation Applied to P+N Junction Solar Cells", CP866, Ion, Implantation Technology, American Institute of Physics, vol. 866, Jan. 2006, pp. 253-256.

Written Opinion in dated May 10, 2012, (Singapore Patent Application No. 201106457-3).

Written Opinion in dated Jun. 8, 2012, (Singapore Patent Application No. 201009194-0).

Written Opinion dated Jun. 8, 2012, Singapore Patent Application No. 201009191-6.

Younger et al. "Ion Implantation Processing for High Performance Concentrator Solar Cells and Cell Assemblies," Solar Cells, vol. 6, 1982, pp. 79-86.

"Implantation par Immersion Plasma (PULSION®)," Ion Beam Services (IBS), ZI Peynier Rousset, France, Dec. 2008.

Janssens et al., "Advanced Phosphorus Emitters for High Efficiency SI Solar Cells," 24th European Photovoltaic Solar Energy Conference, Hamburg, Germany Sep. 21-25, 2009.

Neuhaus et al., "Industrial Silicon Wafer Solar Cells," Hindawi Publishing Corporation, vol. 2007, pp. 1-15, Sep. 14, 2007.

Nikiforov et al., "Large Volume ICP Sources for Plasma-Based Accelerators," Korea Electrotechnology Research Institute (KERI), APAC 2004, Gyeongju, Korea.

Office Action (Non-Final) dated Dec. 5, 2012 (Chinese Application No. 200980128201.7).

Office Action (Non-Final) dated Jan. 14, 2013 (U.S. Appl. No. 12/728,105).

Office Action (Non-Final) dated Jan. 16, 2013 (U.S. Appl. No. 12/821,053).

Office Action (Non-Final) dated Jan. 28, 2013 (U.S. Appl. No. 12/482,685).

Steckl, "Particle-Beam Fabrication and in Situ Processing of Integrated Circuits," Proceedings of the IEEE, vol. 74, Issue 12.

Written Opinion dated Jun. 8, 2012, (Singapore Patent Application No. 201009191-6).

Written Opinion in dated Jan. 11, 2013, (Singapore Patent Application No. 201106457-3).

Xu, et al., Nanopantography results: continuous writing of etched Si 'nano-Ts' with $AR^+ / CI_2$.

"Varian Introduces a New High-Energy Ion Implant System for Optimized Performance and Lowest Cost of Ownership," Press Release, Business Wire, Jul. 14, 1999, 1 pg.

Walther, S.R. et al., "Using Multiple Implant Regions to Reduce Development Wafer Usage," Jan. 1, 2006, American Institute of Physics, CP866, Ion Implantation Technology, pp. 409-412.

Semiconductor Consulting Service publication: "Process Technology for the 21st Century," Chapter 10-Substrates, Isolation, Well and Transistor Formation, Jan. 1999, downloaded from IC Knowledge.com, http://www.icknowledge.com/our_products/pt21c.html., pp. 10-1-10-4.

"Leading Semiconductor Manufacturer Selects Axcelis HE3 Ion Implantation Equipment; 300 mm Facility to Choose Axcelis Platform for High Energy Implant," Business Wire, Oct. 17, 2000, 1 pg.

Kondratenko, S. et al, "Channeling Effects and Quad Chain Implantation Process Optimization for Low Energy Boron Ions," abstract, IEEE Xplore Digital Library, Issue date: Sep. 22-27, 2002, Current version date: Jan. 7, 2004, 1 pg., downloaded from ieeexplore.ieee.org/xpl/freeabs_all.jsp?arnumber=1257941.

Nitodas, S.F., et al., "Advantages of single and mixed species chaining for high productivity in high and mid-energy implantation," published Sep. 2002, Ion Implantation Technology, Current version date Jan. 7, 2004, abstract, downloaded from ieeexplore.ieee.org., 1 pg.

Eaton Nova (Axcelis) 200E2 H/C Implanter, data sheet, 2 pgs., Jan. 1990.

Anders, André, "Plasma and Ion Sources in Large Area Coating: A Review," Elsevier, www.sciencedirect.com, available Sep. 13, 2005, Surface and Coatings Technology 200 (2005) pp. 1893-1906.

\* cited by examiner

APPLICATION SPECIFIC IMPLANT SYSTEM AND METHOD FOR USE IN SOLAR CELL FABRICATIONS

RELATED APPLICATION

This application claims priority under 35 U.S.C. §119(e) to the co-pending U.S. Provisional Application Ser. No. 61/131,687, filed Jun. 11, 2008, entitled "SOLAR CELL FABRICATION USING IMPLANTATION," co-pending U.S. Provisional Application Ser. No. 61/131,688, filed Jun. 11, 2008, entitled "APPLICATIONS SPECIFIC IMPLANT SYSTEM FOR USE IN SOLAR CELL FABRICATIONS," co-pending U.S. Provisional Application Ser. No. 61/131,698, filed Jun. 11, 2008, entitled "FORMATION OF SOLAR CELL-SELECTIVE EMITTER USING IMPLANTATION AND ANNEAL METHODS," and co-pending U.S. Provisional Application Ser. No. 61/133,028, filed Jun. 24, 2008, entitled "SOLAR CELL FABRICATION WITH FACETING AND IMPLANTATION," co-pending U.S. Provisional Application Ser. No. 61/210,545, filed Mar. 20, 2009, entitled "ADVANCED HIGH EFFICIENCY CRYSTALLINE SOLAR CELL FABRICATIONS METHOD," which are all hereby incorporated by reference as if set forth herein.

FIELD OF THE INVENTION

This invention relates to the manufacture of semiconductor devices. More specifically, this invention relates to systems for and methods of fabricating solar cells.

BACKGROUND OF THE INVENTION

Semiconductor devices are manufactured using multi-purpose semiconductor fabrication tools. Because of the ever-decreasing dimensions of current semiconductor devices, these tools fabricate devices according to strict specifications. Being multi-purpose, these tools generate ions of different species for different fabrication steps, using beams that span a wide range of energies. Capable of fabricating small-geometry devices, these tools have strict scanning dimensions. They also perform mass analyses to reduce contamination and include a special module to neutralize the collected charge on a substrate. Because these tools are so complex and their requirements are so stringent, their output is relatively small, only about 200 wafers per hour.

FIG. 1 show a prior art implant system 100 for implanting substrates as one step in fabricating a semiconductor device. Multiple wafers are introduced into the system 100 through twin load locks 105. A multiple gas delivery module 110 contains multiple gases from which n-type and p-type ions (dopants) are extracted. The ions are accelerated by a pre-accelerator 120, which transmits them to a magnet 125 that performs mass analysis to reduce contamination. The ions are then transmitted to a post-accelerator 130 and then on to a charge neutralization module 135. The beam of ions is scanned across the surfaces of multiple wafers 101 using a beam scanning mechanism 140; alternatively, the wafers 101 themselves are moved relative to the beam. A Measurements and Control unit 145 then analyzes the wafers 101.

Because the system 100 must be able to implant different dopants, the operating range of the pre-accelerator 120 and the magnet 125 must be large, generally less than 10 keV to 200 keV-sufficient to implant all the dopant types. The system 100 must also be capable of satisfying the stringent requirements of advanced geometries (smaller than 65 nm). As one example, uniformity requirements of less than 0.5% require multiple beam scans, which reduces system productivity.

A second drawback is that features on the devices vary during different stages of device fabrication. These features cannot withstand the high temperatures or collected charge to which they are exposed. Furthermore, the features themselves can adversely affect the implant beam, such as when an insulating film collects charge during its formation.

With few exceptions, device fabrication requires beams with large power densities and the generation of high temperatures. These limitations in general make prior art fabrication systems complex.

SUMMARY OF THE INVENTION

In a first aspect, a system for implanting a semiconductor substrate includes an ion source, an accelerator to generate from the ion source a beam having an energy no more than 150 keV, and a beam director to expose the substrate to the beam. In one embodiment, the ion source includes a single-species delivery module that includes a single-gas delivery element and a single-ion source. The beam director includes a focusing element, such as electrostatic and electromagnetic optics, used to focus or shape the beam onto the substrate. In another embodiment, the ion source includes a plasma source (such as a single-ion plasma source) that generates the ions that are extracted. This other embodiment also includes an accelerator and a beam director that spreads the ions to encompass or otherwise fully cover the substrate.

In one embodiment, the single-ion plasma source has a beam slot length of between 5 and 10 cm and a width of less than 5 mm. Alternatively, the single-ion plasma source has a broader slot length, width, or both. Additionally, a magnetron generated plasma source can be used to generate a very large plasma that the substrate can be immersed within for implantation. The ion source contains an n-type dopant, such as antimony, arsenic, or phosphorous. Of course, other n-type dopants can also be used. Alternatively, the ion source contains a p-type dopant, such as boron, aluminum, gallium, indium, or $BF_2$. Other p-type dopants can also be used.

The beam has a power density of about 5 kW per square centimeter. In one embodiment, the single-ion source is plug-compatible with the system, such as with the single-species delivery module.

In one embodiment, the beam director includes a scanning element to step the beam across the substrate in orthogonal directions.

In a second aspect, a method of fabricating a semiconductor device includes forming photo-receptive regions within a substrate, doping the photo-receptive regions to form gridlines, and coupling metal fingers to the gridlines. The photo-receptive regions are doped with a dopant at a first concentration and with the dopant at a second concentration larger than the first to form the gridlines. The gridlines extend from topmost surfaces of the photo-receptive regions down into the substrate. The photo-receptive regions are doped and the gridlines are formed using a system that includes a single-species delivery module. Metal fingers are coupled to the gridlines. Thus, the substrate has photo-receptive regions of low dopant distribution and of high dopant distribution underneath the metal fingers.

In one embodiment, the substrate is doped singly, separately from other substrates. In another embodiment, the substrate is doped in a group, with other substrates.

In one embodiment, the gridlines are formed by exposing the substrate through a mask to an ion beam containing the dopant. The mask is displaced from a surface of the substrate and has openings sized to widths of the gridlines. Alternatively, the widths are at a known deviation from the widths of the gridlines. In another embodiment, the mask is placed on a surface of the substrate and has openings adjacent to the locations where the gridlines are to be formed. In still another embodiment, the gridlines are formed by shaping or pulsing a plasma beam containing the dopant to a width of the gridlines and directing the beam onto the photo-receptive regions. In this latter embodiment, the plasma beam is stationary. In another embodiment, the ion beam is scanned across the photo-receptive regions to sequentially form the gridlines, or it is generated to form the gridlines simultaneously.

In one embodiment, the first concentration (dose) is less than 1E15 per square centimeter. The photo-receptive regions have a resistance of approximately 100 ohms per square. The gridlines have a resistance of about 10 to 30 ohms per square, are no more than 200 microns wide, and are no more than 5 millimeters apart. In one embodiment, the gridlines are about 3 millimeters apart.

The method further includes implanting a metal seed on each of the gridlines before coupling them to metal fingers, thus forming a metal silicide.

In one embodiment, the method also includes annealing the substrate, such as by using a furnace, a flash lamp, or a laser. The substrate can be annealed in a single step at low temperatures, such as between 400 and 500° C.

In a third aspect, a method of fabricating a solar cell includes doping photo-receptive regions within a substrate to a first concentration using an ion beam having an energy of no more than 150 kV, doping the photo-receptive regions to a second concentration larger than the first concentration using the ion beam to form gridlines, and coupling metal fingers to the gridlines. The gridlines extend from topmost surfaces of the photo-receptive regions down into the substrate. The substrate is 156 mm×156 mm, the photo-receptive regions are doped using a system that includes a single-species delivery module. The system has a throughput of at least 1,000 wafers per hour.

DETAILED DESCRIPTION OF THE INVENTION

Systems in accordance with the invention are specifically tailored to fabricate specific semiconductor devices, such as solar cells. These systems use tolerances that are more relaxed than those required to fabricate other semiconductor devices. They fabricate devices more quickly, less expensively, and in a smaller space than do prior art systems. Such systems are capable of producing at least 1,000 solar cells per hour.

Systems are further simplified because no charge neutralization is used since wafers have no featured coverings, scanning is simplified, and mass analyses can be performed using other methods. All of these advantages result in an output higher than can be realized using traditional semiconductor fabrication systems.

Systems in accordance with the embodiments also produce more efficient solar cells, solar cells with doping profiles tailored to reduce ohmic losses and the effects of dead layers.

Figure 1:
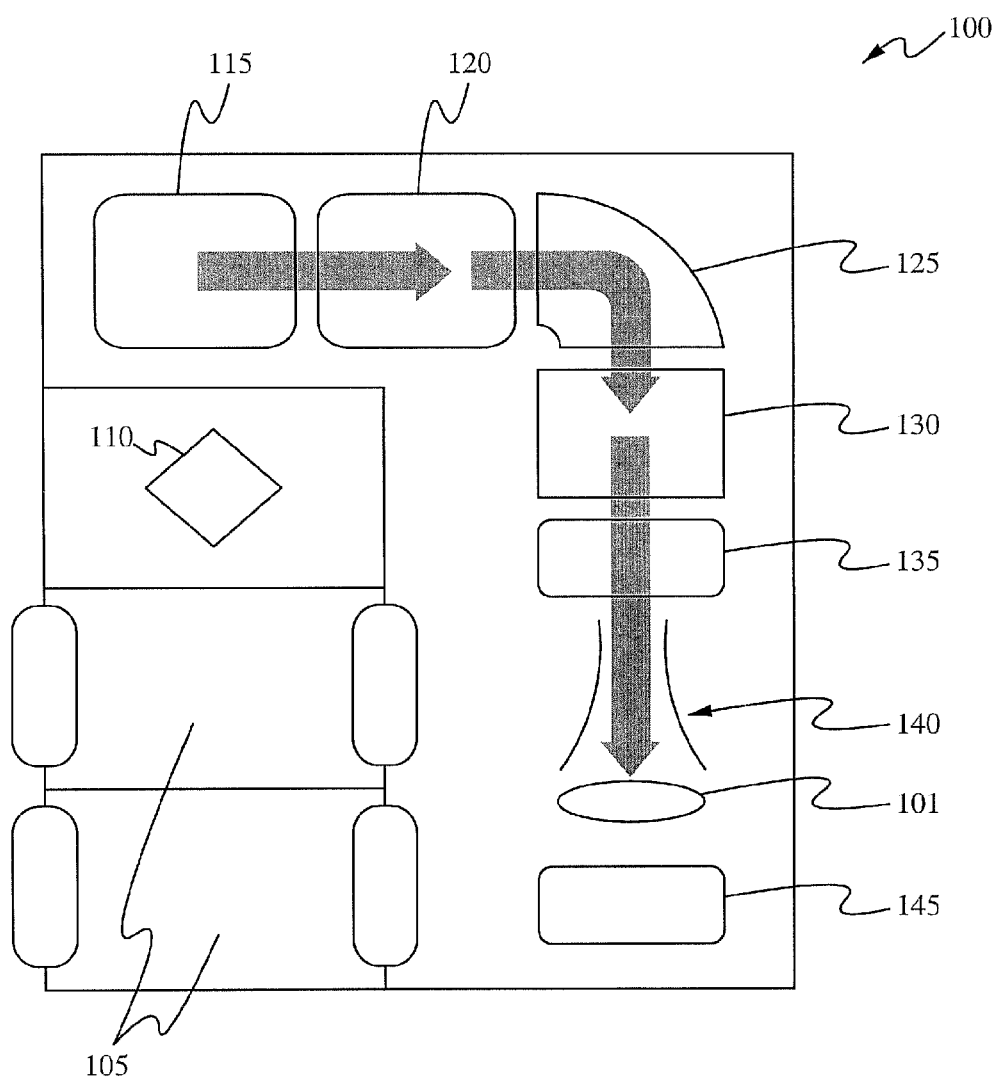
FIG. 1 shows a prior art semiconductor device fabrication system.
Figure 2:
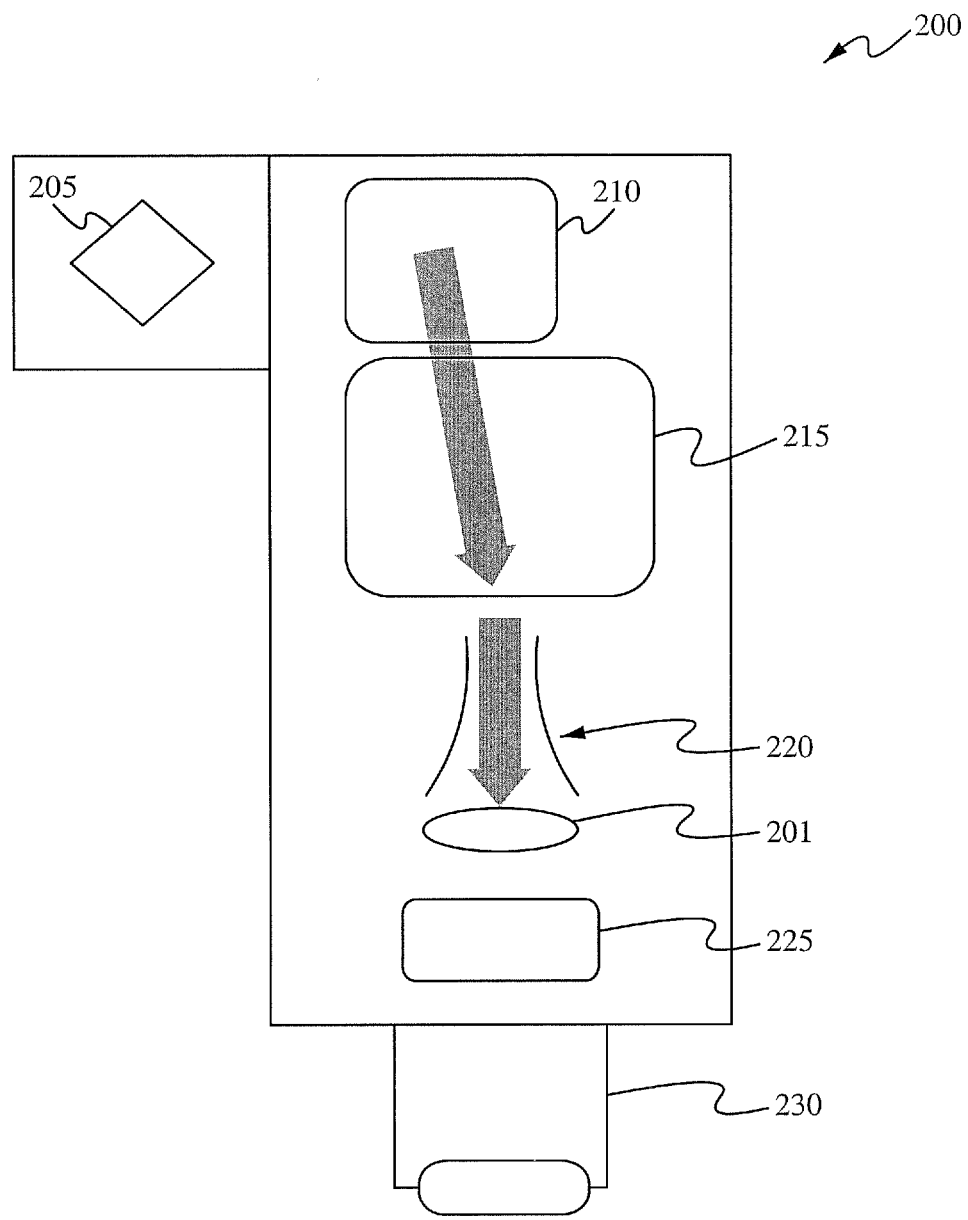
FIG. 2 shows a semiconductor device fabrication system according to the embodiments.

FIG. 2 shows a system 200 for fabricating solar cells in accordance with one embodiment. The system 200 is simpler than the prior art system of FIG. 1: It has a higher productivity, has a smaller footprint, and has plug-compatible components (which can be swapped out and replaced with other species-specific modules). The system 200 includes a single-gas delivery module 205, an ion source 210, an accelerator 215, a skewed Beam Scanning, Mass Analysis, and Beam Shaping module 220, a Measurement and Control module 225, and a single load lock 230 to handle a single solar cell 201. In another embodiment (not shown), the single-gas delivery module 205 and ion source 210 are replaced with a plasma source module, and the Beam Shaping module 220 is replaced with a spreader for spreading a plasma beam onto the solar cell 201.

The system 200 has specific capabilities. It will be appreciated that not all embodiments have these capabilities. The ion source 210 has a long slot. In alternative embodiments, the ion source 210 includes multiple ion sources for the formation of broad and narrow, or plasma beams. The ion source 210 produces beam currents up to 100 mA of all species but is dedicated to a single species at one time. The ion source 210 is also plug-compatible for each specific application: when a new application with a different ion beam source is required, the ion source 210 can be pulled out and replaced with a different one that meets requirements (e.g., different dopant) of the next application. The ion source 210 has a beam slot of less than 5 to 10 cm and a width of 1 to 2 mm. Alternatively, the ion source 210 is a plasma source and can be configured to produce a broad beam. The length can be stretched to cover one dimension of a 156 mm×156 mm substrate or both dimensions of the substrate.

In operation, the single-gas delivery module 205 and ion source 210 together generate an ion beam, which is accelerated by the accelerator 215, either in DC fashion or pulsed. In one embodiment (FIG. 3), the accelerator has extraction and focusing elements with a limited energy range, such as between 15 and 150 keV. In other embodiments, other limited energy ranges are used. Preferably, to limit the energy requirements of the system 200, the accelerator 215 does not operate above 100 keV.

Next, the resulting skewed beam is controlled using the Beam Scanning, Mass Analyzing, and Shaping module 220. The beam is further measured and controlled using the Measurement and Control module 225 before or at the same time as the beam impinges on a single wafer 201. The single wafer 201 can be stepped in front of the beam to implant dopants according to a predetermined pattern, using a single beam to cover the entire surface of the wafer 201. In one embodiment, the wafer 201 is 156 mm×156 mm, but the system 200 is capable of processing wafers of other dimensions. In alternative embodiments, a wafer is deployed before the beam on a moving platen, or one or more wafers on a tray are exposed to the beam.

Finally, the processed single wafer 201 is removed from the system 200 through the single load lock 230.

Figure 3A:
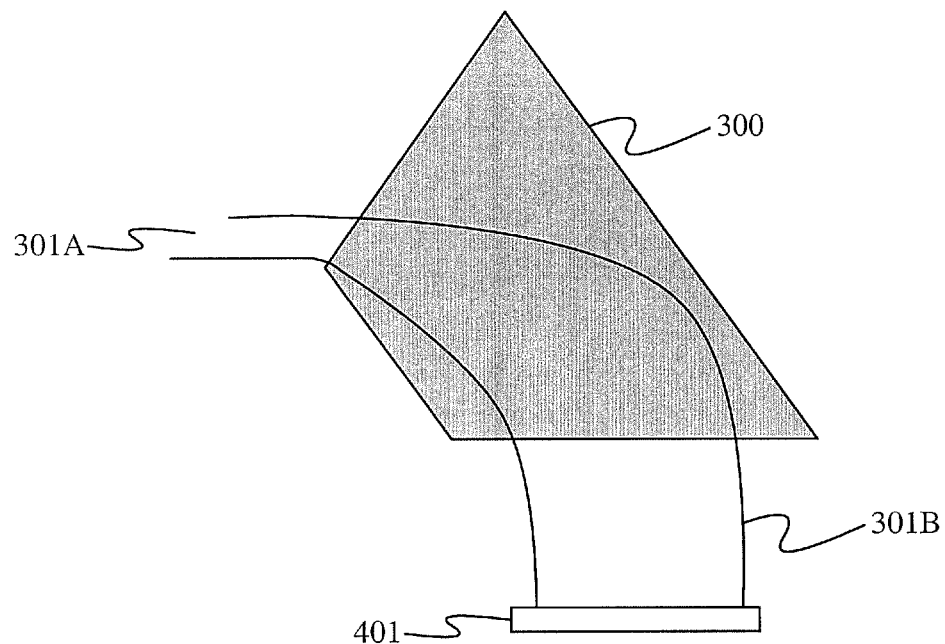
FIGS. 3A and 3B show beam optics for shaping beams in accordance with the embodiments.
Figure 3B:
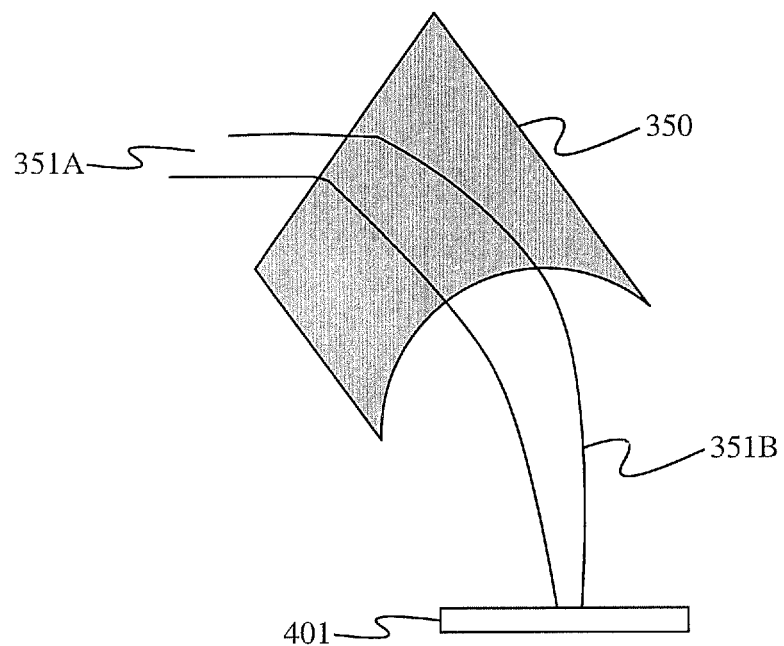

FIGS. 3A and 3B are beam shapers 300 and 350 (also referred to as "beam optics") in accordance with two embodiments for shaping beam spots to implant dopants into a substrate 401. In one embodiment, the beam shapers 300 and 350 form part of the Beam Shaping module 220 of FIG. 2. The beam shapers 300 and 350 each comprises a magnetic or electrostatic lens. As discussed in more detail below, the shapers 300 and 350 can be used to implant selective emitters in semiconductor solar cells.

The beam shaper 300 is a "large dimension" shaper. The beam shaper 300 receives a beam 301A having a first width and shapes it to produce a beam 301B having a second width, larger than the first, of about 5 to 10 cm, up to the dimensions of the substrate and its holder. Alternatively, the second width is about 15.6 cm.

The beam shaper 350 is a "short dimension" shaper. The beam shaper 350 receives a beam 351A having a first width and shapes it to produce a beam 351B having a second width, smaller than the first, of about 200 microns. Alternatively, the second width is about 50 microns.

The beam shapers 300 and 350 are also able to eliminate unwanted impurities entrained within a beam. For example, a slight change in the scanning angle can eliminate unwanted neutral particles or species with different charge-to-mass ratios. Alternatively, the internal cladding inside of the chamber containing the beam can be made to minimize the side wall contamination, in particular when the beam is a plasma beam.

Using the beam shapers 300 and 350, the Beam Scanning, Mass Analyzing, and Shaping module 220 (FIG. 2) is able to "shape" beams to implant semiconductors of varying geometries.

Preferably, the beam spot dimension, beam currents, and scanning methods have a beam power density of 5 kW/cm$^2$ and do not raise the average temperature of the wafer 201 (FIG. 2) more than 150° C. in its bulk. The wafer 201 is cooled using back side cooling, elastomeric methods, or electrical cooling methods.

Beam-limited pulse-shaping methods can also be used to cool a wafer. Using these methods, the temperature of a wafer is limited by sharing a beam between any other single wafers, within one or more batches of wafers, all using automated controls. Alternatively, the system can use a pulse plasma source to distribute the heat over time rather than position.

As explained above, embodiments of the invention are well suited for fabricating semiconductor solar cells. The following co-pending patent applications, each of which is incorporated by reference in its entirety, describe different ways of fabricating solar cells: U.S. application Ser. No. 12/482,980, filed Jun. 11, 2009, titled "Solar Cell Fabrication Using Implantation," by Babak Adibi and Edward S. Murrer, and having Attorney Docket No. SITI-00100; U.S. application Ser. No. 12/483,017, filed Jun. 11, 2009, titled, "Formation of Solar Cell-Selective Emitter Using Implant and Anneal Method," by Babak Adibi and Edward S. Murrer, and having Attorney Docket No. SITI-00300; and U.S. application Ser. No. 12/482,685, filed Jun. 11, 2009, titled "Solar Cell Fabrication with Faceting and Ion Implantation," by Babak Adibi and Edward S. Murrer, and having Attorney Docket No. SITI-00400. FIGS. 4, 5A-C and 6 illustrate using the system 200 (FIG. 2) to fabricate a solar cell in accordance with the embodiments.

Solar cells function by receiving light energy on a lightly doped photo-receptive surface that overlies a doped semiconductor substrate, producing electron-hole pairs. The electrons in these pairs form currents that travel along the layer in the substrate, on to a heavily doped selective emitter that draws them to gridlines, to metallic fingers and busbars, and ultimately to a load. These electrons then travel back to the bulk of the substrate, where they recombine with the separated holes.

Generally, the photo-receptive regions are doped in the same step and thus to the same concentration as the area under the gridlines. For such doping, the use of these diffusion methods creates a heavy excess of un-activated dopant species very near the surface of the substrate. This results in a "dead layer": Because the photo-receptive regions need to be lightly doped but have an excess of un-activated dopants, captivated electrons are formed when light strikes the solar cell and recombine with un-paired holes before generating any current. This effect reduces the efficiency of the solar cell.

The dead layer can be reduced by better control of un-activated dopants near the surface region of the substrate. The embodiments shown in FIGS. 4 and 5A-C show how the selective emitter can be formed by doping the photo-receptive regions to a concentration larger than that in between the gridlines.

Figure 4:
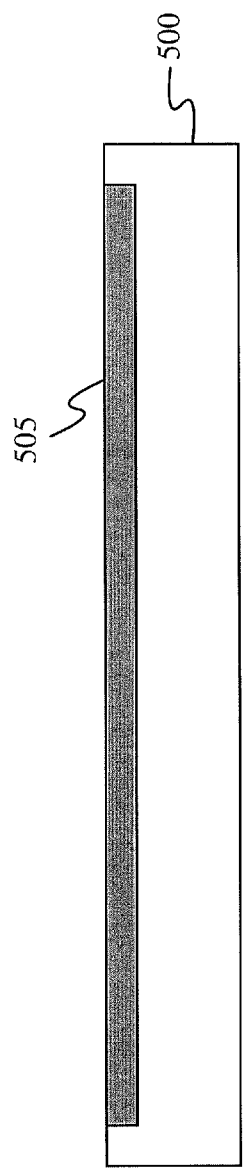
FIG. 4 shows a lightly doped photo-receptive region of a solar cell in accordance with one embodiment.

FIG. 4 is a side-cross-sectional view of a substrate 500 to be formed into a solar cell and having a lightly doped photo-receptive region 505. In this example, the substrate 500 is a p-type semiconductor substrate and the region 505 is doped with n-type ions at a first concentration. The region 505 has a resistance of about 100 ohms per square; excess dopants impede the generation and transport of the dopant charge carriers. The region 505 is typically implanted with an energy implant of less than about 50-100 keV at a concentration of less than 1E15/cm$^2$. Some examples of n-type dopants are antimony, arsenic, and phosphorous.

In accordance with the embodiments, the substrate 500 is doped using a beam that is broadened to provide whole coverage or is scanned rapidly (element 220, FIG. 2) in the x-direction, the y-direction, or both to cover the entire substrate 500. For solar cells, non-uniformity of coverage is estimated at less than 5% (e.g., uniformity of coverage at more than 95%), thus requiring similar homogeneity in the beam spot profile. The beam shapers 300 and 350, shown in FIGS. 3A and 3B, allow for high productivity implantation.

Figure 5A:
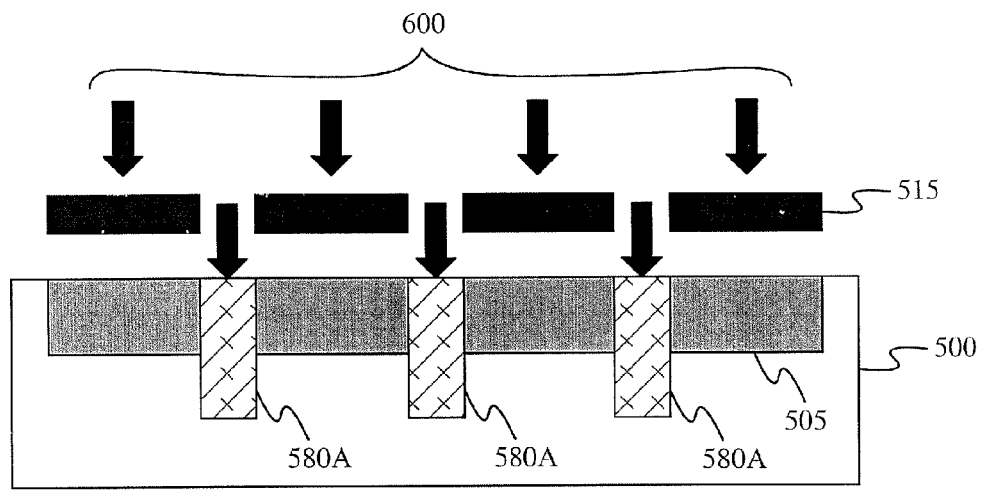
FIGS. 5A-C show forming gridlines by doping the photo-receptive region of FIG. 4 in accordance with different embodiments.
Figure 5B:
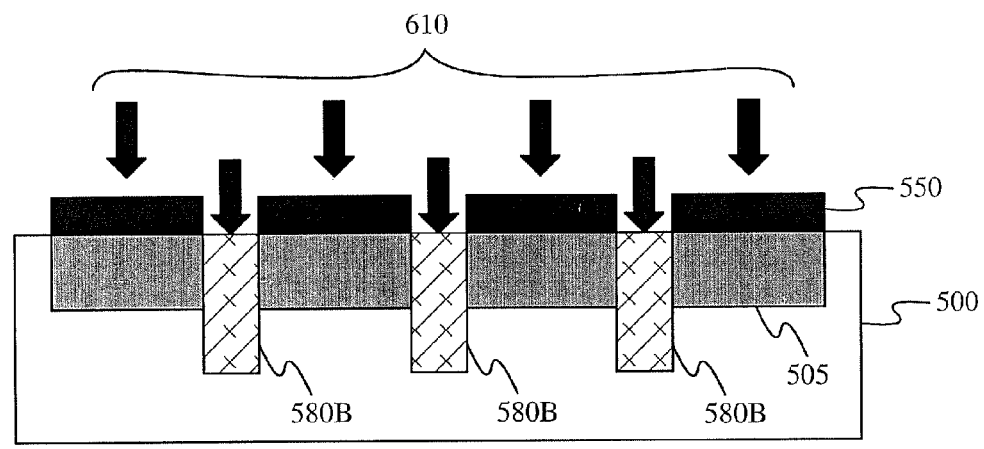
Figure 5C:
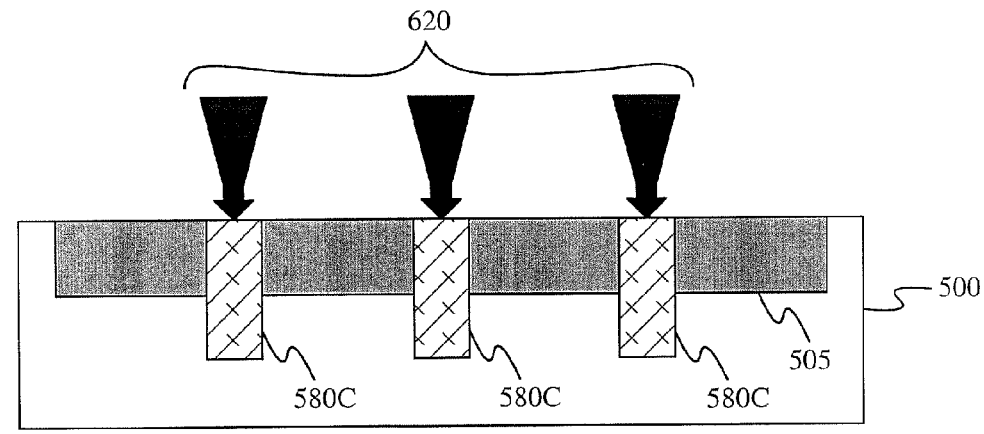

FIGS. 5A-C show alternative ways to dope the substrate 500 with an n-type dopant, at a higher concentration than the lightly doped region 505, to form the gridlines 580A-C, thus reducing the formation of a dead layer. In the embodiment shown in FIG. 5A, a physical mask 515 is positioned above the photo-receptive regions 505. The mask 515 has openings shaped to the dimensions of the desired gridlines 580A; alternatively, the openings are slightly larger than the dimensions of the gridlines 580A, by a known amount. An ion beam 600 is then directed onto the mask 515 to thereby form the gridlines 580A. In alternative embodiments, the beam 600 is a plasma beam, to which the substrate 500 is exposed. This arrangement can be used in combination with beam scanning or beam shaping methods, such as described above, to maximize the beam utilization.

In the embodiment shown in FIG. 5B, a mask 550 is placed on the photo-receptive regions 505. The mask 550 can be hard or soft, and can be formed using lithography, contact printing, or screen printing. Alternatively, an already existing mask used for contact deposition can also be used. Again, an ion beam 610 is directed onto the mask to thereby implant the gridlines 580B. In alternative embodiments, a plasma beam is used instead of the ion beam 610.

In the embodiment shown in FIG. 5C, an implant beam 620 is shaped to dope the substrate 500 and thus form the gridlines 580C. This arrangement can use a series of beam lets for simultaneous exposure, using a single scanning and stepping beam spot that scribes across the substrate 500. Alternatively, a broad and narrow beam can be used to individually expose one or any number of the gridlines 580C.

Figure 6:
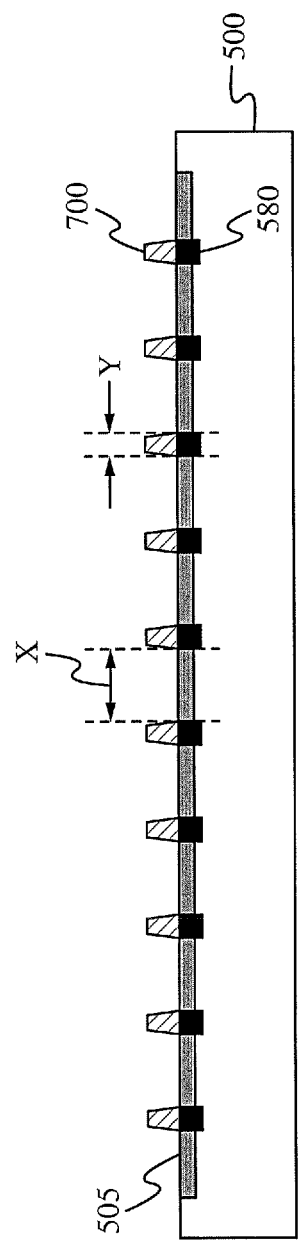
FIG. 6 shows using seeds to couple the gridlines to metal fingers of the solar cell of FIG. 4 in accordance with one embodiment.

FIG. 6 shows the substrate 500 after later processing steps, in which the work function and bad gap are adjusted by the formation of a metal/semiconductor region. As shown in FIG. 6, a metallic species 700 is implanted on regions below the contact fingers, on top of the gridlines 580 (any one of 580A-C), and also on a back surface of the substrate 500 (not shown). Such "seed" implants increase the contact performance to the metallic fingers (attached to the gridlines) and to the load.

Referring to FIG. 6, the doping between adjacent gridlines 580 is approximately 100 ohms per square, the doping under the gridlines 580 is less than 10-30 ohms per square, the distance X between grid lines is about 3 mm and is expected to be reduced to 1 mm, and the width Y of the metallic species (the metallic fingers) is about 200 microns and is expected to be reduced to 50 microns.

The substrate 500 can be grown single or mono-crystalline, poly-crystalline, or multi-crystalline silicon, thin-film deposited silicon, or any other materials used to form solar cells. It will be appreciated that other types of substrates and dopings can be used. As only one example, the substrate 500 can be n-type and the gridline 580A can be p-type. Examples of p-type dopants include boron and boron diflouride. Those skilled in the art will recognize many other combinations of semiconductor types, ions, doping levels, and other characteristics.

FIGS. 7, 8, 9A, and 9B are all used to illustrate how systems in accordance with the embodiments (e.g., the system 200 in FIG. 2) tailor doping profiles to reduce the formation of dead layers and ohmic losses.

Figure 7:
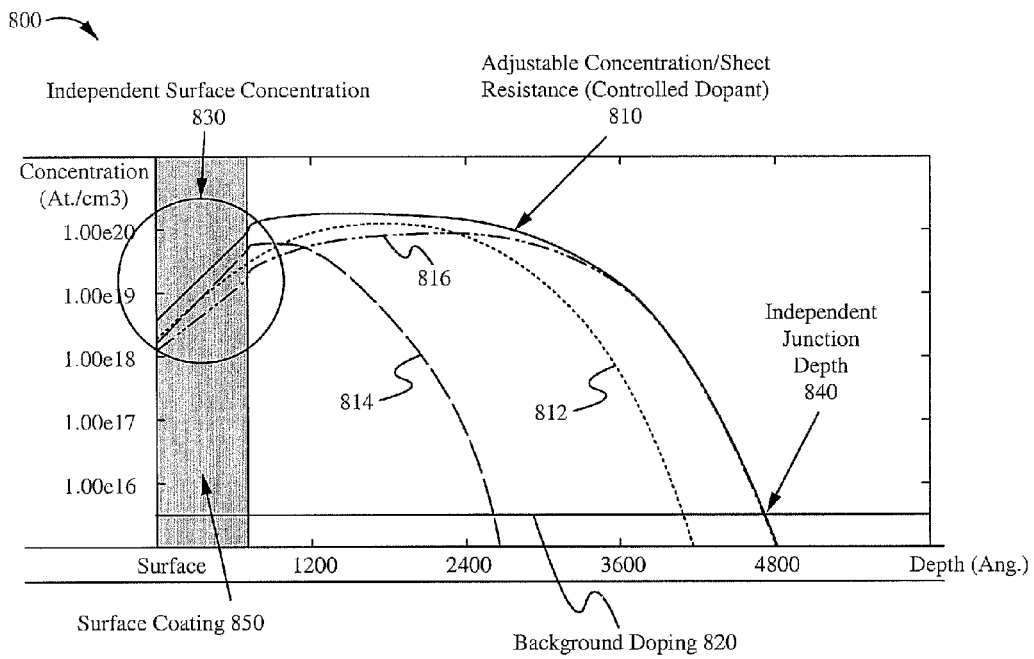
FIG. 7 is a profile tailoring graph in accordance with one embodiment.

FIG. 7 illustrates one embodiment of a profile tailoring graph 800 in accordance with the principles of the present invention. The graph 800 represents the atomic profile of a solar cell with respect to dopant concentration (At./cm$^3$) versus its dopant depth (Ang.). The total atomic profile is represented by line 810. Through the use of multiple ion implants, each having a different concentration-versus-depth profile, the dopant concentration (and thus the resistivity) of the solar cell can be precisely adjusted and controlled across predetermined depths by the user. Graph 800 shows three different implantation profiles 812, 814, and 816. The combination of these three profiles results in the total profile 810 of the solar cell.

Although each individual implantation can be limited to a Gaussian or pseudo-Gaussian distribution, the present invention combines them to effectively tailor the shape of the total atomic profile. In controlling the total atomic profile through the use of multiple independent implants, the present invention enables the user to effectively control the junction depth 840, where the implanted dopant of one type (such as n-type dopant) meets the dopant of the pre-doped background region 820 (such as p-type dopant). The user is also enabled to also control the dopant concentration 830 at or near the surface of the solar cell. The present invention allows the user to control the surface concentration 830 and the junction depth 840 independently of one another. In some embodiments, the atomic profile is tailored to have the junction depth in the range of approximately 0.01 micrometers to approximately 0.5 micrometers. In some embodiments, the atomic profile is tailored to have the surface concentration in the range of approximately 5E18 At./cm$^3$ to approximately 4.8E21 At./cm$^3$. However, it is contemplated that the atomic profile can be tailored to have different junction depths and surface concentrations.

Figure 8:
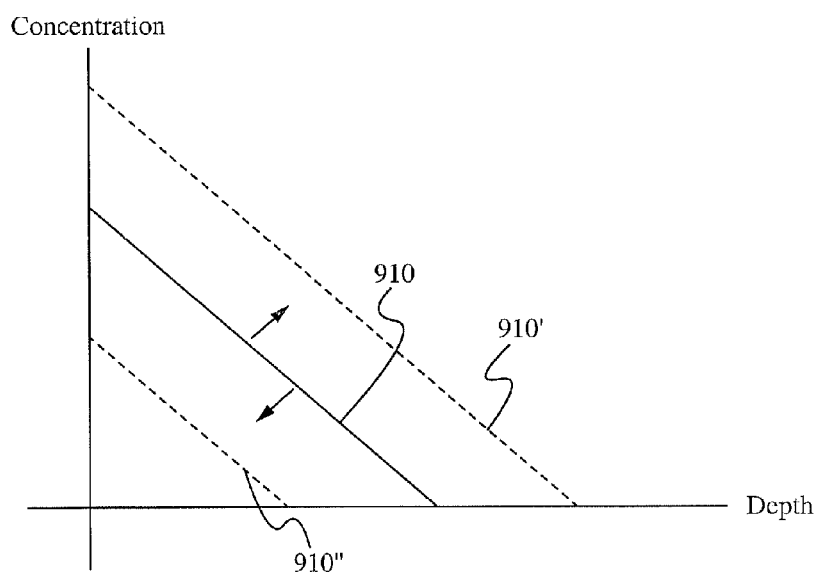
FIG. 8 is a graph illustrating the deficiencies in profile tailoring ability for solar cells that are doped using diffusion.

In the prior art, the adjustment of the atomic profile is limited. FIG. 8 is a graph 900 illustrating the deficiencies in profile tailoring ability for solar cells that are doped using diffusion. Here, line 910 represents an atomic profile for a solar cell. The use of diffusion to dope the semiconducting wafer prevents the user from being able to independently control the surface concentration and the junction depth. The user is limited to either making the profile 910 deeper by simply increasing the concentration and depth together to line 910' or making the profile 910 shallower by decreasing the concentration and depth together to line 910". The user is not able to change the shape of the atomic profile and affect one aspect of the atomic profile more than the other.

Figure 9A:
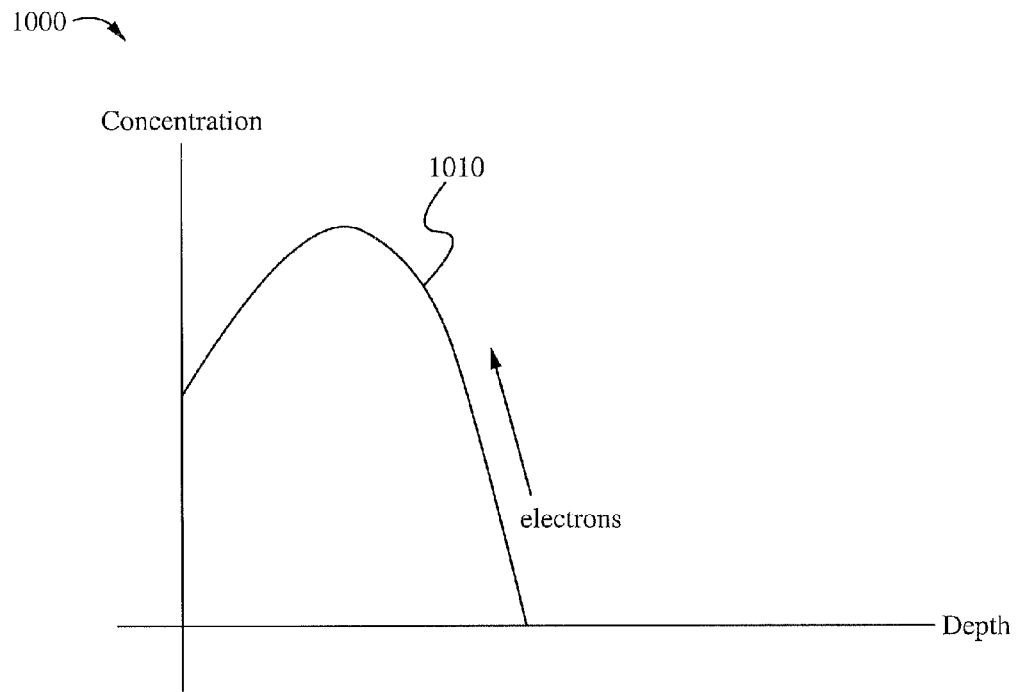
FIGS. 9A and B are graphs illustrating the advantages in profile tailoring ability for solar cells that are doped using ion implantation in accordance with one embodiment.
Figure 9B:
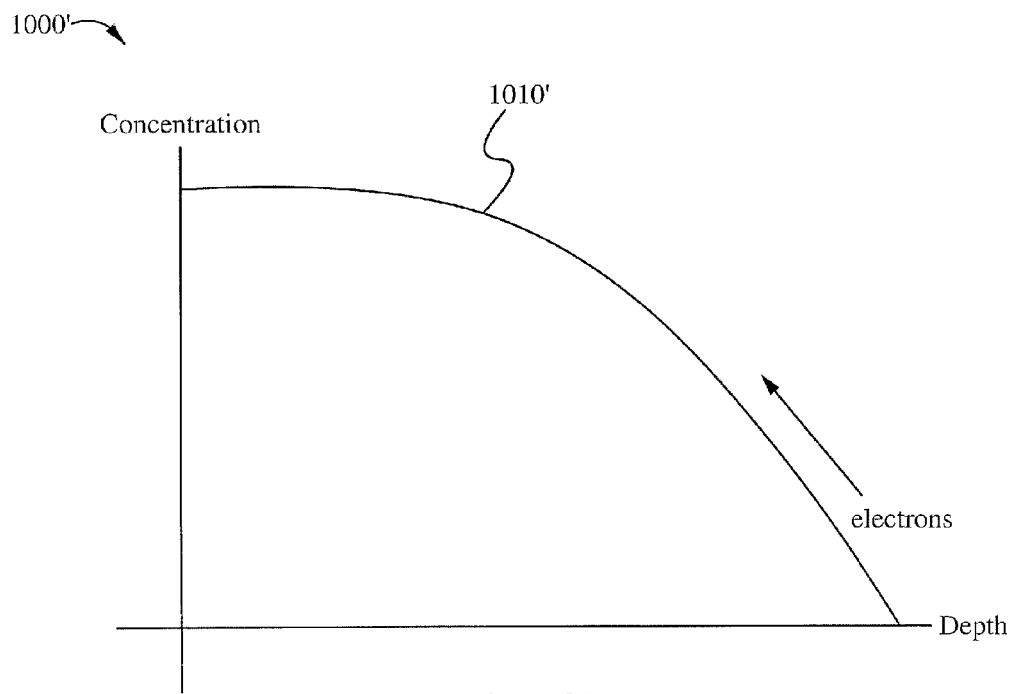

FIGS. 9A-B are graphs illustrating the advantages in profile tailoring ability for solar cells that are doped using ion implantation in accordance with the principles of the present invention. In graph 1000 of FIG. 9A, the atomic profile 1010 in terms of concentration-versus-depth is illustrated for a solar cell formed using prior art methods. Here, the profile 1010 is limited to a simple Gaussian distribution, making it difficult for the electrons generated in the electron-hole pair generating region to travel up to the contacts. The steep slope of the profile 1010 reflects the significant increase in dopant concentration (and thus resistivity) as the electrons travel towards conductive contacts at the surface of the wafer. This steep slope can make it more difficult for the electrons to reach the contacts, thus resulting in an undesirable loss of electricity.

In graph 1000' of FIG. 9B, the atomic profile 1010' in terms of concentration-versus-depth is illustrated for a solar cell formed using the multiple ion implants of the present invention. The profile 1010' can be shaped to form a more gradual (less steep) increase in concentration as the electrons travel towards the contacts at the surface of the semiconducting wafer. This tailoring of the atomic profile is made possible by the use of multiple ion implants to independently control the junction depth and the surface concentration, as well as everything in between.

In FIG. 7, the different implantations 812, 814, and 816 can determine different aspects of the solar cell. For example, in some embodiments, line 812 (the mid-range implant) determines the homogeneous emitter, while lines 814 and 816 are added as a series of selective implants to provide the selective emitter region. These implantation steps can be performed either on blanket substrates, without any covering, or through any anti-reflective covering (e.g., nitride, oxide or any other films), as well as on surface texturing that is required for solar cell fabrications. In the case of texturing, ion implantation provides a good adherence to the surface contour, and thus improves the contact formation. Texturing is described in U.S. provisional application No. 61/133,028, which is incorporated by reference above. Graph 800 of FIG. 7 shows surface coating 850, such as the anti-reflective coating previously discussed. This coating can be any thickness.

Figure 10:
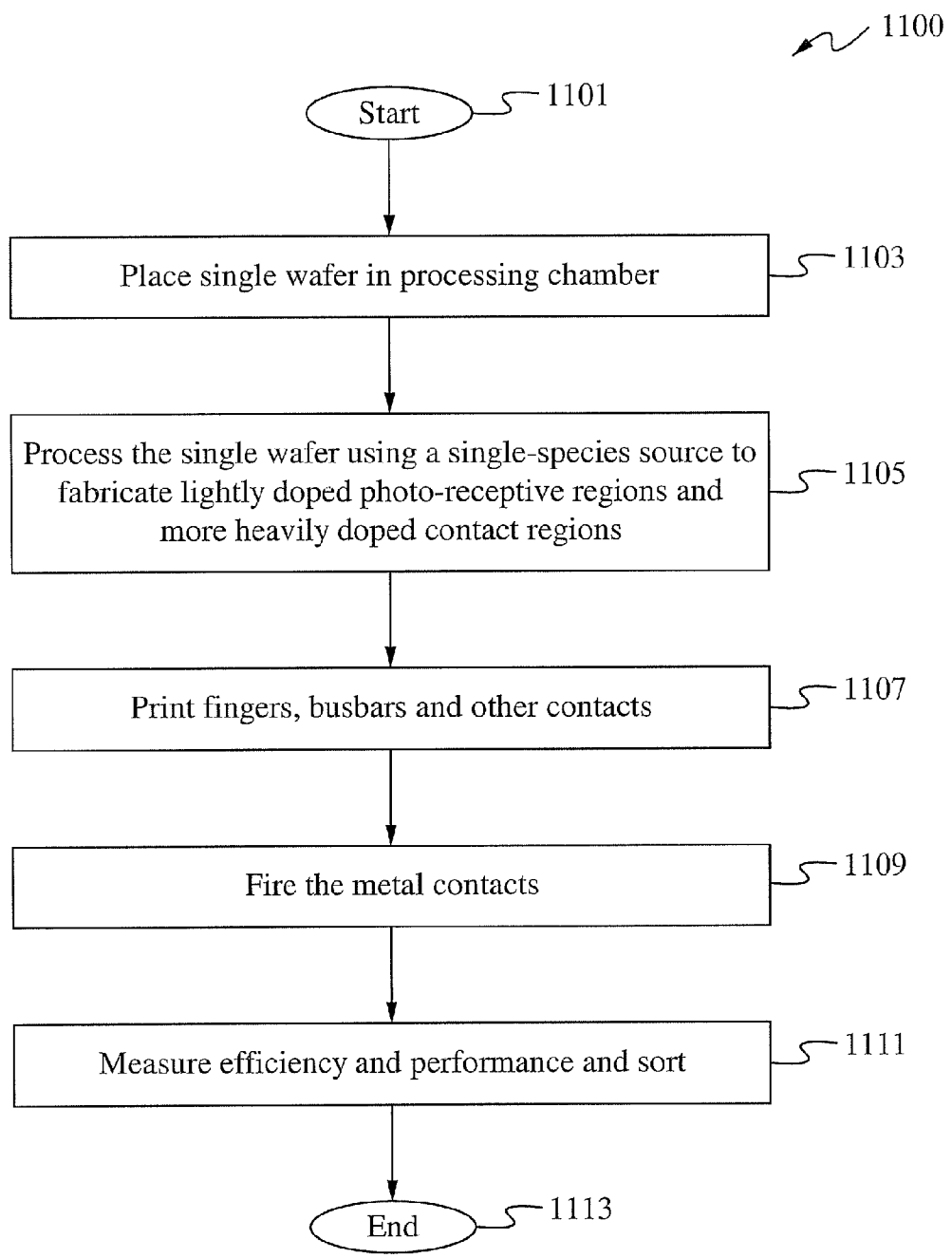
FIG. 10 shows the steps of a process for fabricating a solar cell in accordance with one embodiment.

FIG. 10 is a flow chart showing the steps of a process 1100 for fabricating a solar cell in accordance with the embodiments. Referring to FIGS. 2 and 10, the process starts in the step 1101 in which, for example, a specific ion source 210 required to fit the processing application is plugged into the system 200. In the step 1103, a single wafer is placed into the load lock 230. In the step 1105, the wafer is processed by doping photo-receptive regions at one concentration and at a higher concentration to form the gridlines. This step can include multiple doping cycles.

Next, in the step 1107, contact seeds, printed or inkjet printed metallic fingers, busbars and other contacts are formed. In the step 1109, the wafer is fired to establish the contacts and activate and anneal the substrate dopings. The wafer can be annealed using a furnace, flash lamp or laser, to name only a few devices, at temperatures between 400 and 500 degrees centigrade, temperatures lower than those required using prior art systems. Preferably, only a single annealing step is required. The wafer can also be annealed at different temperatures for a time that brings about comparable results.

In the step 1111, the wafer is measured for performance and then sorted. The process ends in the step 113.

Preferably, the steps 1100 are performed by a controller using (1) computer-executable instructions stored on a computer-readable medium and (2) a processor that executes the instructions. Referring to FIG. 2, in one embodiment this controller (not shown) is operatively coupled to the Beam Scanning, Mass Analysis and Beam Shaping module 220, the Measurement and Control module 225, or both.

Though the embodiments describe solar cells, it will be appreciated that other semiconductor devices can be fabricated in accordance with the embodiments.

It will be readily apparent to one skilled in the art that other modifications may be made to the embodiments without departing from the spirit and scope of the invention as defined by the appended claims.

What is claimed is:

1. A method of fabricating a semiconductor device comprising:
    doping photo-receptive regions within a substrate to a first concentration;
    doping the photo-receptive regions to a second concentration larger than the first concentration to form gridlines, wherein the gridlines extend from topmost surfaces of the photo-receptive regions down into the substrate; and
    coupling metal fingers to the gridlines,
    wherein the photo-receptive regions and the gridlines are doped using a system
    comprising a single-species delivery module; and,
    further comprising implanting a seed on each of the gridlines before coupling the gridlines to metallic fingers.

2. The method of claim 1, wherein the substrate is doped separately from other substrates.

3. The method of claim 1, wherein forming the gridlines comprises exposing the substrate through a mask displaced from a surface of the substrate to an ion beam containing a dopant, wherein the mask has openings sized to widths of the gridlines.

4. The method of claim 1, wherein forming the gridlines comprises exposing the substrate through a mask coupled to a surface of the substrate to an ion beam containing a dopant, wherein the mask has openings adjacent to where the gridlines are to be formed.

5. The method of claim 1, wherein forming the gridlines comprises shaping a beam containing dopants to a width of the gridlines and directing the beam onto the photo-receptive regions.

6. The method of claim 5, wherein directing the beam comprises scanning the beam across the photo-receptive regions to sequentially form the gridlines.

7. The method of claim 5, wherein directing the beam comprises generating the beam to simultaneously form the gridlines.

8. The method of claim 1, wherein the first concentration is less than 1E15 per square centimeter.

9. The method of claim 1, wherein the photo-receptive regions have a resistance of at least 100 ohms per square.

10. The method of claim 1, wherein the gridlines have a resistance of about 10 to 30 ohms per square.

11. The method of claim 1, wherein the gridlines are no more than 200 microns wide.

12. The method of claim 1, wherein the gridlines are no more than 5 millimeters apart.

13. The method of claim 1, further comprising annealing the substrate at between 400 and 500 degrees Centigrade.

14. The method of claim 1, further comprising forming a contact on a back surface of the substrate.

15. A method of fabricating a solar cell comprising:
    doping photo-receptive regions within a substrate to a first concentration using an ion beam having an energy of no more than 150 kV;
    doping the photo-receptive regions to a second concentration larger than the first concentration using the ion beam to form gridlines, wherein the gridlines extend from topmost surfaces of the photo-receptive regions down into the substrate; and
    coupling metal fingers to the gridlines,
    wherein the substrate is 156 mm×156 mm, the photo-receptive regions are doped using a system comprising a single-species delivery module, and a throughput of the system is at least 1,000 wafers per hour; and,
    further comprising implanting a seed on each of the gridlines before coupling the gridlines to metallic fingers.

* * * * *